(12) United States Patent
Grönninger et al.

(10) Patent No.: US 8,405,065 B2
(45) Date of Patent: Mar. 26, 2013

(54) LED SEMICONDUCTOR BODY

(75) Inventors: Günther Grönninger, Seubersdorf (DE); Christian Jung, Pielenhofen (DE); Peter Heidborn, Zeitlarn (DE); Alexander Behres, Pfatter (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 604 days.

(21) Appl. No.: 12/375,528

(22) PCT Filed: Jul. 27, 2007

(86) PCT No.: PCT/DE2007/001349
§ 371 (c)(1),
(2), (4) Date: Aug. 11, 2009

(87) PCT Pub. No.: WO2008/014772
PCT Pub. Date: Feb. 7, 2008

(65) Prior Publication Data
US 2009/0302307 A1    Dec. 10, 2009

(30) Foreign Application Priority Data

Jul. 31, 2006    (DE) .......................... 10 2006 035 627

(51) Int. Cl.
*H01L 31/00* (2006.01)
*H01L 29/06* (2006.01)

(52) U.S. Cl. .................. 257/13; 372/45.01; 372/45.012; 372/99; 438/39; 438/478; 438/32; 257/18; 257/14; 257/15; 257/E21.09

(58) Field of Classification Search .................... 372/45, 372/45.01, 45.012, 99; 257/82, E25.032, 257/E21.09, 13–15, 18; 438/39, 478, 32
See application file for complete search history.

(56) References Cited

U.S. PATENT DOCUMENTS

| | | | |
|---|---|---|---|
| 5,521,935 A | 5/1996 | Irikawa | |
| 6,020,601 A | 2/2000 | Noguchi et al. | |
| 6,356,572 B1 * | 3/2002 | Tanaka et al. | 372/45.01 |
| 6,657,233 B2 | 12/2003 | Sato et al. | |
| 6,711,195 B2 * | 3/2004 | Chang et al. | 372/45.01 |
| 7,709,851 B2 | 5/2010 | Bader et al. | |

(Continued)

FOREIGN PATENT DOCUMENTS

| | | |
|---|---|---|
| DE | 102005016592 | 11/2005 |
| DE | 10 2004 026 125 | 12/2005 |

(Continued)

OTHER PUBLICATIONS

I. Schnitzer et al., "30% external quantum efficiency from surface textured, thin-film ligh-emitting diodes", Appl. Phys. Lett. 63, vol. 16, pp. 2174-2178, Oct. 18, 1993.

(Continued)

*Primary Examiner* — Telly Green
(74) *Attorney, Agent, or Firm* — Cozen O'Connor

(57) ABSTRACT

An LED semiconductor body includes a semiconductor layer sequence which comprises a quantum structure which is intended to produce radiation and comprises at least one quantum layer and at least one barrier layer, wherein the quantum layer and the barrier layer are strained with mutually opposite mathematical signs.

21 Claims, 2 Drawing Sheets

U.S. PATENT DOCUMENTS

| | | | |
|---|---|---|---|
| 2003/0235224 A1 | 12/2003 | Ohlander | |
| 2004/0017835 A1 | 1/2004 | Jewell et al. | |
| 2004/0066818 A1* | 4/2004 | Yamamoto et al. | 372/45 |
| 2004/0218647 A1* | 11/2004 | Hirukawa et al. | 372/46 |
| 2004/0223527 A1* | 11/2004 | Hirukawa et al. | 372/44 |
| 2004/0233961 A1* | 11/2004 | Lutgen | 372/70 |
| 2005/0090031 A1* | 4/2005 | Illek et al. | 438/46 |
| 2005/0110037 A1 | 5/2005 | Takeda et al. | |
| 2005/0161699 A1 | 7/2005 | Hon | |
| 2005/0169334 A1* | 8/2005 | Sato | 372/45 |
| 2005/0266588 A1 | 12/2005 | Stauss | |
| 2006/0067374 A1* | 3/2006 | Kishimoto | 372/46.01 |
| 2006/0131557 A1 | 6/2006 | Shimizu et al. | |
| 2006/0186420 A1* | 8/2006 | Hirukawa et al. | 257/82 |
| 2006/0198404 A1* | 9/2006 | Henrichs | 372/29.02 |
| 2006/0222040 A1* | 10/2006 | Schmid et al. | 372/99 |
| 2008/0191194 A1* | 8/2008 | Braddell | 257/14 |
| 2008/0197369 A1* | 8/2008 | Batres et al. | 257/98 |
| 2008/0205461 A1* | 8/2008 | Henrichs | 372/29.023 |
| 2008/0212636 A1* | 9/2008 | Sato et al. | 372/50.11 |
| 2009/0173961 A1* | 7/2009 | Windisch et al. | 257/99 |
| 2009/0238227 A1* | 9/2009 | Kubota et al. | 372/45.011 |
| 2009/0238591 A1* | 9/2009 | Watanabe et al. | 399/51 |
| 2009/0275160 A1* | 11/2009 | Hirukawa et al. | 438/39 |
| 2009/0302429 A1* | 12/2009 | Plossl et al. | 257/621 |

FOREIGN PATENT DOCUMENTS

| | | |
|---|---|---|
| EP | 0 727 821 | 5/1990 |
| EP | 0 700 138 | 8/1995 |
| EP | 0 731 511 | 9/1996 |
| JP | 09-162482 | 6/1997 |
| JP | 2005-109124 | 4/2005 |
| JP | 2005-175462 | 6/2005 |
| JP | 2006-120884 | 5/2006 |
| JP | 2006-196880 | 7/2006 |
| JP | 2007-012688 | 1/2007 |
| TW | 200536162 | 11/2005 |

OTHER PUBLICATIONS

G. Zhang et al., "Strain-Compensated InGaAs/GaAsP/GaInAsP/GaInP quantum well lasers ({0.98 UM) grown by gas-source molecular beam epitaxy", Applied Physics Letters, AIP, American Institute of Physics, vol. 62, No. 14, pp. 1644-1646, Apr. 5, 1993.

C.J. Mitchell et al., "Material characterization of highly strained and partially strain compensated $In_xGa_{1-x}As/In_yAl_{1-y}As$ quantum cascade light emitting diodes grown by mbe for emission in the near infrared (2-4/splmu/m)", Electron Devices for Microwave and Optoelectronic Applications, 10$^{th}$ IEEE Int'l Symposium, pp. 8-13, Nov. 18, 2002.

* cited by examiner

LED SEMICONDUCTOR BODY

RELATED APPLICATIONS

This is a U.S. national stage under 35 USC §371 of application No. PCT/DE2007/001349, filed on Jul. 27, 2007.

This application claims the priority of German Patent Application No. 10 2006 035 627.6 filed Jul. 31, 2006, the entire content of which is hereby incorporated by reference.

FIELD OF THE INVENTION

The invention relates to an LED semiconductor body which is intended to produce radiation.

BACKGROUND OF THE INVENTION

In LED semiconductor bodies, the internal quantum efficiency, that is to say the ratio of photons produced in the semiconductor body to the electron-hole pairs injected into the semiconductor body, is often considerably less than the ideal value of 1.

SUMMARY OF THE INVENTION

One object of the present invention is to provide an LED semiconductor body with better characteristics. A particular aim is to increase the internal quantum efficiency and to reduce the spectral width of the radiation emitted during operation of the LED semiconductor body. A further aim is to improve the linearity of the power of the emitted radiation with respect to the operating current at high operating current levels.

In one embodiment of an LED semiconductor body according to the invention, the LED semiconductor body has a semiconductor layer sequence which comprises a quantum structure which is intended to produce incoherent radiation and comprises at least one quantum layer and at least one barrier layer. In this case, the quantum layer and the barrier layer are strained with mutually opposite mathematical signs.

Since the barrier layer is subject to strain with an opposite mathematical sign to the strain of the quantum layer, the strain of the quantum layer can be compensated for by means of the strain of the barrier layer. This can lead to better crystal quality in the semiconductor layer sequence. It is thus advantageously possible to avoid dislocations which are formed to an increased extent in a heavily strained quantum layer.

The intrinsic lattice constant of semiconductors generally depends on the material composition of the semiconductor. If the semiconductor layers are sufficiently thin, the lattice constant of the semiconductor layer may differ from the corresponding intrinsic lattice constant of the semiconductor material.

For the purposes of the invention, a semiconductor layer is regarded as being strained in particular when a semiconductor layer is created during the deposition, for example epitaxial deposition, on a reference layer, which semiconductor layer has a lattice constant which is different in the lateral direction, that is to say in a direction at right angles to the direction of the deposition, from the intrinsic lattice constant of the semiconductor layer. In this case, the lattice constant of the strained semiconductor layer in the lateral direction is equal to that of the reference layer.

In particular, the reference layer may be a growth substrate on which the semiconductor layer is deposited, or a semiconductor buffer layer whose lattice constant does not differ or does not differ significantly from the intrinsic lattice constant of the semiconductor buffer layer.

Strained semiconductor layers which, as described above, have the lattice constant of the reference layer in the lateral direction, and in which the strain does not relax, or it relaxes only to a minor extent, in the form of dislocations, are also referred to as pseudomorph.

Semiconductor layers whose lattice constant is less than their intrinsic lattice constant are referred to as being compressive-strained or positively strained.

Analogously to this, semiconductor layers whose lattice constant is greater than their intrinsic lattice constant are referred to as being tensile-strained or negatively strained.

A compressive-strained, that is to say positively strained, and a tensile-strained, that is to say negatively strained, semiconductor layer are therefore strained with mutually opposite mathematical signs.

The accumulated strain of a semiconductor layer can be partially or completely compensated for by a semiconductor layer located above or below it and strained with the opposite mathematical sign, and this is also referred to as strain compensation. One measure for the strain of n successively arranged strained semiconductor layers is the so-called mean strain $V_0$ which is given by $$V_O = \frac{\sum_{l=1}^{n} f_l d_l}{\sum_{l=1}^{n} d_l},$$

where $f_l$ is the strain of the l-th semiconductor layer and $d_l$ is the thickness of the l-th semiconductor layer. The product $f_l \cdot d_l$ is the product of the strain and layer thickness of the l-th semiconductor layer. In this case, the strain $f_l$ is given by $$f_l = \frac{g_l - g_0}{g_0},$$

where $g_l$ is the intrinsic lattice constant of the l-th semiconductor layer, and $g_0$ is the lattice constant of the reference layer, and therefore the actual lattice constant of the strained semiconductor layer.

If the layer thicknesses and the strain are chosen suitably, the mean strain of the strained semiconductor layers can be partially or completely compensated for, that is to say, in simple terms, to a value of 0.

This strain compensation makes it possible to deposit comparatively thick semiconductor layer stacks with a high crystal quality. Crystal defects such as dislocations, which occur to an increased extent in heavily strained layers, can thus advantageously be reduced.

In a preferred refinement, the quantum structure has at least one further quantum layer and at least one further barrier layer, wherein the further quantum layer and the further barrier layer are strained with mutually opposite mathematical signs.

The LED semiconductor body preferably has four or more quantum layers and particularly preferably ten or more quantum layers, for example fifteen quantum layers.

A large number of quantum layers such as this has the advantage that the LED semiconductor body can be distinguished during operation by better linearity when high currents are flowing, in particular currents of more than 0.5 A.

This means that the radiation power of the radiation which is produced in the LED semiconductor body rises linearly with the operating current, even at high current levels, when the operating current is increased. The greater the number of quantum layers, the higher is the value of the operating current up to which the radiation power of the radiation which is produced in the LED semiconductor body increases linearly with the operating current.

In a preferred refinement, the quantum structure is intended to produce radiation with a peak wavelength in the wavelength range between 750 nm and 1050 nm inclusive. This spectral range, in particular its component beyond the sensitivity of the human eye, is advantageous, for example, for sensor systems with a transmitter and receiver, since the human eye is not disturbed by radiation from the transmitter.

In an advantageous development, the quantum structure is designed such that the width at half maximum of the emission spectrum of the radiation produced by the quantum structure is 70 nm or less, preferably 60 nm or less, and particularly preferably 50 nm or less, for example between 40 and 45 nm inclusive. In this case, the width at half maximum means the full spectral width of the emitted radiation at half the maximum radiation power (FWHM, full width at half maximum).

When LEDs which emit in a narrow band are used as transmitters, sensor systems with a transmitter and receiver can be produced in a simplified manner. Furthermore, an emission spectrum with as narrow a spectral width as possible in the near infrared is advantageous since spectral tails of the spectrum in the visible spectral range can be reduced. This therefore makes it possible to easily avoid dazzling of the human eye.

In a preferred refinement, at least one quantum layer is compressive-strained, and one barrier layer is tensile-strained. The compressive strain of the quantum layer can be completely or at least partially compensated for by means of the tensile-strained barrier layer. The strain is compensated for completely when the absolute value of the product of the strain of and the layer thickness of the quantum layer is equal to the product of the strain of and layer thickness of the barrier layer, with these products having different mathematical signs. This advantageously makes it possible to achieve an LED semiconductor body with a high crystal quality. The formation of crystal defects such as dislocations can be reduced.

In particular, the strain compensation makes it possible to produce a semiconductor layer sequence in which the sum of the thicknesses of the quantum layers is above the critical layer thickness for a quantum layer. The critical layer thickness of a semiconductor layer is in this case a material-specific upper limit for pseudomorphic growth of the semiconductor layer. Above the critical layer thickness, typically the strain relaxes in the form of dislocations, reducing the crystal quality. In comparison to a semiconductor layer sequence in which the strain of the quantum layer is not compensated for, the strain compensation makes it possible to increase the number of quantum layers.

In a further preferred refinement, the absolute value of the strain of at least one barrier layer is less than a strain of the quantum layer. The absolute value of the strain of the barrier layer is preferably between a value of 0.2 and 0.67 inclusive, particularly preferably between 0.33 and 0.5 inclusive of the absolute value of the strain of the quantum layer. In this case the barrier layer is preferably correspondingly thicker than the quantum layer, in order to compensate for the strain of the quantum layer.

In a preferred development, the ratio of the thickness of the barrier layer to the thickness of the quantum layer is greater than or equal to 1, preferably greater than or equal to 1.5, and particularly preferably greater than or equal to 2.5, for example up to 3.

In the case of quantum structures in which the thickness of the barrier layer which is arranged between two adjacent quantum layers is greater than the individual thicknesses of the quantum layers, the quantized states forming in the quantum layers of the charge carriers can be decoupled more easily from the states of the adjacent quantum layer. This decoupling makes it easier to produce spectrally narrowband radiation by means of the quantum structure.

In a preferred development, the thickness of the barrier layer is 5 nm or more, preferably 10 nm or more, and particularly preferably 20 nm or more. As the thickness of the barrier layer increases, two quantum layers which are separated from one another by means of the barrier layer can be decoupled from one another particularly well.

In a preferred refinement, the quantum layers and the barrier layers are arranged in an alternating sequence on one another in the quantum structure. In this case, the barrier layers are each preferably designed such that the product of the strain of and layer thickness of a quantum layer is in each case completely or essentially completely compensated for by the product of the strain of and layer thickness of the subsequent barrier layer. This can lead to a reduction in the mean strain of the quantum structure. It is therefore advantageously possible to form a quantum structure which has a high crystal quality and is thicker than a semiconductor layer sequence without strain compensation.

In particular, the number of dislocations that are created in the quantum structure can be reduced. This makes it possible to reduce the number of charge carriers which recombine at such dislocations in the quantum structure, without emitting radiation. This can advantageously result in increased internal quantum efficiency during operation of the semiconductor body.

In a preferred refinement, the LED semiconductor body contains a III-V semiconductor material, for example $In_yGa_{1-y}As$ where $0 \leq y \leq 1$, preferably where $y \neq 0$. At least one quantum layer preferably contains $In_yGa_{1-y}As$ where $0 \leq y \leq 0.5$, preferably where $0.05 \leq y \leq 0.3$, and particularly preferably where $0.1 \leq y \leq 0.2$. In the case of $In_yGa_{1-y}As$ the intrinsic lattice constant increases as the indium content increases. The compressive strain of an $In_yGa_{1-y}As$ semiconductor layer with respect to GaAs likewise thus increases as the indium content increases. A compressive-strained $In_yGa_{1-y}As$ semiconductor layer in this case has a higher lattice constant in the deposition direction than in the lateral direction.

An LED semiconductor body with a quantum layer which contains $In_yGa_{1-y}As$ can be distinguished by high quantum efficiency, in particular in the wavelength range from 750 nm to 1050 nm, inclusive.

By way of example the barrier layer may contain $Al_xGa_{1-x}As_{1-z}P_z$ where $0 \leq x \leq 1$ and $0 \leq z \leq 1$, preferably where $z \neq 0$. The intrinsic lattice constant of a semiconductor layer such as this decreases as the phosphorus content increases, with the lattice constant in the deposition direction in a tensile-strained $Al_xGa_{1-x}As_{1-z}P_z$ semiconductor layer being less than the lattice constant in the lateral direction. With regard to GaAs, the tensile strain increases as the phosphorus content increases, which means that it is possible to compensate for the strain of a compressive-strained semiconductor layer containing $In_yGa_{1-y}As$ by variation of the phosphorus content by means of an $Al_xGa_{1-x}As_{1-z}P_z$ semiconductor layer. Furthermore, the band gap of an $Al_xGa_{1-x}As_{1-z}P_z$ semiconductor layer can be adjusted by the aluminum content. In the case of a quantum well which is formed by means of an $In_yGa_{1-y}As$ quantum layer and two $Al_xGa_{1-x}As_{1-z}P_z$ barrier layers, the energetic depth of the quantum well can be adjusted in a simplified manner by variation of the aluminum content.

In particular, the strained barrier layer can contain $Al_xGa_{1-x}As_{1-z}P_z$ where $0.01 \leq x \leq 1$, preferably where $0.1 \leq x \leq 0.6$, and particularly preferably where $0.2 \leq x \leq 0.4$ and/or where $0.01 \leq z \leq 0.5$, preferably where $0.03 \leq z \leq 0.3$, particularly preferably where $0.05 \leq z \leq 0.2$.

A GaAs substrate can be used as a growth substrate for deposition, for example epitaxial deposition, of the semiconductor layers, for example by means of MBE or MOVPE.

In the case of an LED semiconductor body which has a plurality of quantum layers and a plurality of barrier layers, a plurality of quantum layers and/or barrier layers or all the quantum layers and/or barrier layers may also, of course, have the features mentioned in the quoted referred refinements.

In a preferred refinement, the quantum structure is embedded between two cladding layers, in which case one of the cladding layers may form the reference layer. It is particularly preferable for one cladding layer to be p-doped and for the other cladding layer to be n-doped. The LED semiconductor body can thus be in the form of a PIN diode structure, with the quantum structure preferably being intrinsic.

At least one cladding layer preferably has a band gap which is greater than the band gap of a barrier layer. The cladding layer can therefore represent a potential barrier for the charge carrier located in the quantum structure. This can impede charge carriers from being able to pass from the quantum structure into the cladding layer. This therefore promotes radiating recombination of the charge carriers within the quantum structure.

In a further preferred refinement, the mean strain of the quantum structure is 2000 ppm (parts per million) or less, preferably 1000 ppm or less, particularly preferably 500 ppm or less. The lower the mean strain of the quantum structure, the higher the crystal quality of the quantum structure can be.

In one particularly preferred embodiment, the LED semiconductor body is in the form of a thin-film semiconductor body. In the case of a thin-film semiconductor body and in contrast to a conventional semiconductor body, the growth substrate on which the semiconductor layer sequence of the semiconductor body is deposited, for example epitaxially, is thinned completely or in places, or is removed completely or in places. This may be done, for example, mechanically and/or chemically. A laser separation method or the laser ablation method is also suitable for this purpose.

A thin-film semiconductor chip may comprise the thin-film semiconductor body and a carrier, with the semiconductor body being arranged, preferably mounted, on the carrier. In particular, the carrier is different from the growth substrate of the semiconductor body. The carrier can be used to make the semiconductor body mechanically robust. This is because the growth substrate is no longer required for this purpose and can be thinned or removed without any significant risk of damage to the semiconductor body.

In contrast to the growth substrate, the carrier advantageously does not need to meet the stringent requirements relating to crystalline purity, but can in fact be selected on the basis of other criteria, for example mechanical robustness, and optical, thermal or electrical characteristics.

A thin-film semiconductor chip, for example a thin-film LED chip, can also be distinguished by at least one of the following characteristic features:

a mirror layer is applied or, for example, integrated as a Bragg mirror in the semiconductor layer sequence, is formed on a first main surface, which faces a carrier element, of a semiconductor layer sequence which comprises an active zone, in particular an epitaxial layer sequence, which mirror layer reflects at least a portion of the radiation which is produced in the semiconductor layer sequence back into it;

the semiconductor layer sequence has a thickness in the region of 20 μm or less, in particular in the region of 10 μm; and/or the semiconductor layer sequence contains at least one semiconductor layer with at least one surface which has a thorough mixing structure which, in the ideal case, leads to an approximately ergodic distribution of the light in the semiconductor layer sequence, that is to say it has a scattering behaviour which is as ergodically stochastic as possible.

A fundamental principle of a thin-film light emitting diode chip is described, for example, in I. Schnitzer et al., Appl. Phys. Lett. 63 (16), 18 Oct. 1993, 2174-2176, the disclosure content of which is hereby incorporated in the present application by reference.

In a preferred refinement, a mirror layer is arranged on the semiconductor body. It is particularly preferable for the mirror layer to be arranged between the carrier and the semiconductor body. In this case, the mirror layer is designed to reflect radiation which is produced during operation of the semiconductor body. The mirror layer is also preferably metallic. For example, the metallic mirror layer may contain Au, Ag, Al, Pt or an alloy with at least one of these materials. For example, Au is distinguished by particularly high reflectivity in the red and infrared spectral range.

Radiation which is produced in the quantum structure and runs in the direction of the carrier can be reflected on the mirror layer and can be output from the semiconductor chip on a surface of the semiconductor chip which faces away from the mirror layer and forms a radiation outlet surface. The radiation component which is output through the radiation outlet surface is accordingly advantageously increased. Furthermore, the mirror layer can prevent radiation from being absorbed by the carrier material. This therefore further increases the degrees of freedom for choice of the carrier material.

BRIEF DESCRIPTION OF THE DRAWINGS

Further features, advantageous refinements and expedient aspects of the invention will become evident from the following description of the exemplary embodiments, in conjunction with the figures, in which.

DETAILED DESCRIPTION OF THE DRAWINGS

Identical elements, elements of the same type and elements having the same effect are provided with the same reference symbols in the figures.

Figure 1:
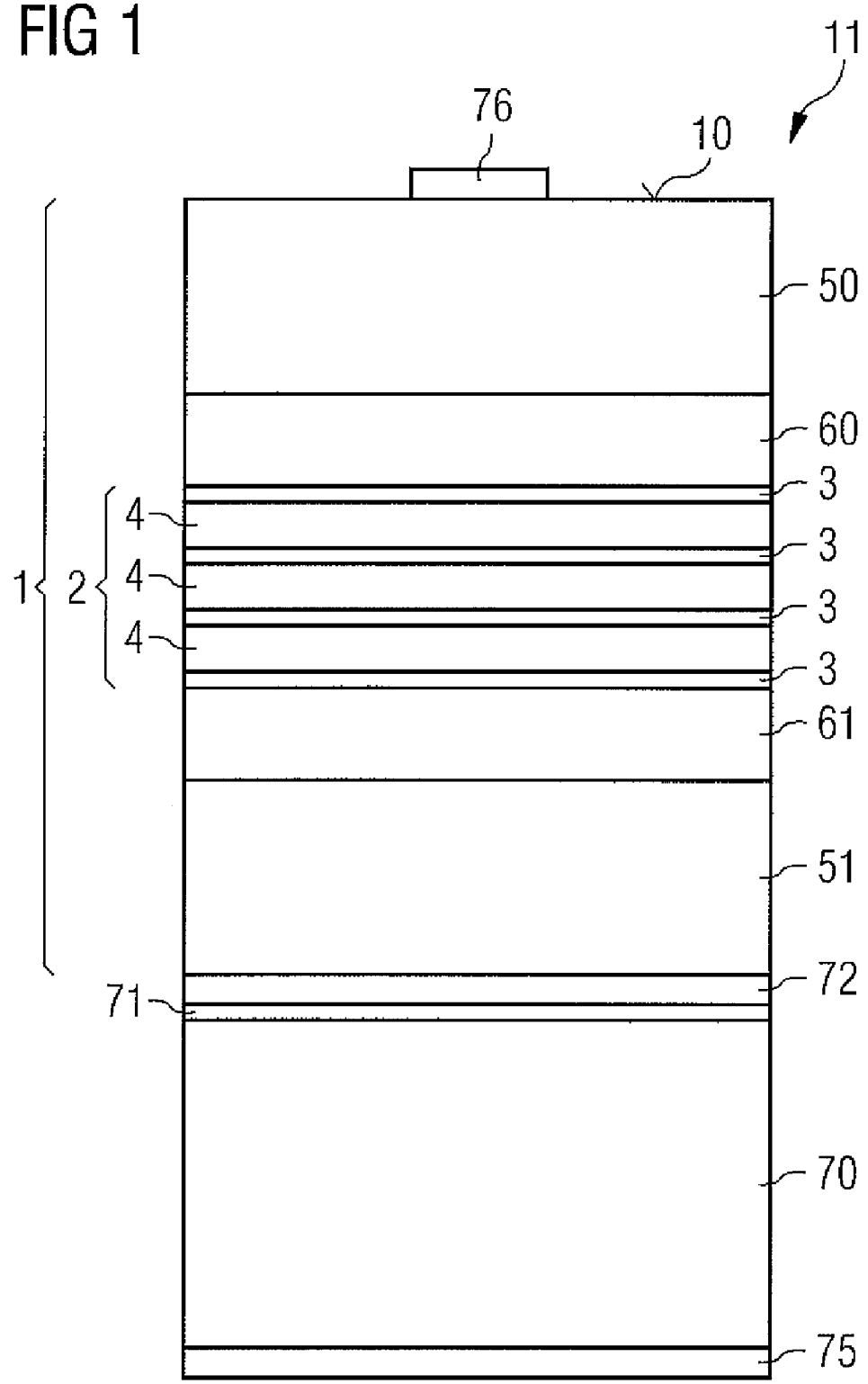
FIG. 1 shows a schematic section view of an LED semiconductor chip with an LED semiconductor body according to an embodiment of the invention.

FIG. 1 shows a schematic section view of the configuration of an LED semiconductor chip 11 with a semiconductor body 1 according to the invention. The LED semiconductor body 1 is formed by a semiconductor layer sequence which comprises a quantum structure 2. This quantum structure comprises, for example, four quantum layers 3, with in each case one barrier layer 4 being arranged between in each case two adjacent quantum layers. If the number of quantum layers is n, the number of barrier layers is generally n−1. In contrast to the exemplary embodiment shown in FIG. 1, the number of barrier layers may, however, also be n+1.

The quantum structure 2 is arranged between a first cladding layer 50 and a second cladding layer 51. A radiation outlet surface 10 is formed by means of one surface of the first cladding layer 50.

The LED semiconductor chip 11 is in the form of a thin-film semiconductor chip. In this case, the LED semiconductor body 1 is arranged on a carrier 70 of the LED semiconductor chip 11. This carrier is different from a growth substrate for the semiconductor body 1, in particular the semiconductor layer sequence. The semiconductor layer sequence is preferably deposited epitaxially on the growth substrate during the production of the semiconductor body, for example by means of MBE or MOVPE. The carrier therefore need not satisfy the stringent requirements relating to crystal purity that are applicable to a growth substrate but can, for example, be optimized for heat dissipation characteristics and/or electrical conductivity. A thin-film semiconductor chip in which the growth substrate for the semiconductor body is removed during production is therefore particularly suitable for high-power LED semiconductor chips in which the heat losses which occur in the semiconductor chip are comparatively high.

Furthermore, the carrier is used to provide mechanical robustness for the semiconductor layer sequence after the removal of the growth substrate. In this case, the removal of the growth substrate can be carried out, for example, mechanically and/or chemically, with the growth substrate being removed or thinned completely or in places. A laser separation method or the laser ablation method can also be used for this purpose. The growth substrate is preferably removed completely. The growth substrate is therefore not illustrated in FIG. 1.

The carrier preferably has a comparatively high thermal conductivity. For example, the carrier may contain germanium or may be composed of germanium. A GaAs carrier can also be used. If the carrier contains a semiconductor material or the carrier is composed of a semiconductor material, then this is preferably suitably doped in order to increase the electrical conductivity.

A mirror layer 72 is arranged between the semiconductor body 1 and the carrier 70 and is preferably applied to the semiconductor body. Radiation which is produced in the quantum structure during operation of the LED semiconductor body and is emitted in the direction of the carrier 70 can be reflected by the mirror layer. This avoids absorption in the structures arranged downstream from the mirror layer, seen from the quantum structure, for example the carrier. The mirror layer may contain a metal or a metallic alloy, and may be metallic. For example, the mirror layer may contain gold, silver, aluminum, platinum or an alloy with at least one of these materials, or may be composed of a material such as this or of an alloy such as this. For example, gold is distinguished by particularly high reflectivities in the yellow, orange, red into the infrared spectral range. In comparison to a Bragg mirror, which can be integrated in the semiconductor body, the mirror layer based on metal or on a metallic alloy can be distinguished by high reflectivity over a comparatively wide spectral range. The dependency of the reflectivity on the angle at which the radiation strikes the mirror layer can also advantageously be reduced in the case of a mirror layer based on metal or an alloy containing metal, in comparison to a Bragg mirror. A mirror layer in the form of a metal layer or an alloy layer is therefore preferable to a Bragg mirror. Radiation which is produced in the quantum structure 2 and strikes the mirror layer can thus be reflected efficiently by the mirror layer. In consequence, the radiation power which emerges from the radiation outlet surface 10 can advantageously be increased.

During the production of the LED semiconductor chip 11, the deposition of the metal or the formation of the alloy of the mirror layer is carried out on the prefabricated semiconductor body 1, in particular after completion of the deposition of the semiconductor body. Suitable methods for the production of the mirror layer 72 are, for example, sputtering or vapour deposition.

Furthermore a connection layer 71 is formed between the mirror layer 72 and the carrier 70. This connection layer is used to attach the semiconductor body 1 to the carrier. The connection layer is preferably electrically conductive and, for example, may be in the form of a solder layer.

Furthermore, a contact 75 is arranged on that side of the carrier 70 which faces away from the LED semiconductor chip. The LED semiconductor body 1 can be electrically connected by means of this contact and the contact 76 which is arranged on the radiation outlet surface 10. Thus, during operation of the LED semiconductor body, charge carriers can be injected by means of these contacts into the quantum structure 2 which is intended to produce radiation. The contact 75 and/or the contact 76 are/is preferably metallic or a metallic alloy. For example, the contact may contain one of the materials Au, Ni, Ti, Pt, Al, Ag or an alloy with at least one of these materials, or may consist thereof. The contact 75 and/or the contact 76 may, of course, also be formed from a plurality of layers, if required.

Alternatively or additionally, the contact may contain or consist of at least one radiation-permeable electrically conductive metal oxide (TCO, transparent conductive oxide) material, for example ITO (indium tin oxide).

By way of example, the contacts 75 and 76 may be produced by means of sputtering or vapour deposition, preferably on the prefabricated semiconductor body 1.

By way of example, the LED semiconductor body may be in the form of a PIN diode structure. In this case, by way of example, the first cladding layer 50 may be p-conductively doped and the second cladding layer 51 may be n-conductively doped, or vice versa. The semiconductor layers of the quantum structure 2, the intermediate layer which is preferably arranged between the quantum structure and the first cladding layer 50, and the intermediate layer 61 which is preferably arranged between the quantum structure and the second cladding layer, are preferably undoped. During operation of the LED semiconductor chip, the recombination of charge carriers injected into the quantum structure leads to spontaneous emission of incoherent radiation. In this case, the radiating recombination of the charge carriers preferably takes place in the quantum layers.

A quantum layer 3 and a barrier layer 4 are strained with mutually opposite mathematical signs. For example, the quantum layer can be compressive-strained, that is to say positively strained, and the barrier layer can be tensile-strained, that is to say negatively strained. The diffusion of crystal faults, for example dislocations, can be reduced by means of a strained quantum layer 3 in an LED semiconductor body 1. Degradation of the LED semiconductor body and a decrease associated with this in the radiation power emitted from the semiconductor body as the operating time increases can advantageously be reduced. An LED semiconductor body having a strained quantum layer can thus be distinguished by a better light aging behaviour.

The mean strain of the semiconductor layer sequence can be reduced by straining the barrier layer 4 with an opposite mathematical sign to the straining of the quantum layer 3. In this case, the barrier layer is preferably designed such that the absolute value of the product of the strain and the layer thickness for the barrier layer and for the quantum layer in each case has the same value or essentially the same value. A high crystal quality can thus be achieved more easily for the semiconductor body 1, in particular for the quantum structure 2. A decrease, which reduces the crystal quality, in the strain of the strained semiconductor layers in the form of crystal defects, for example dislocations, is advantageously reduced. The proportion of charge carriers in the quantum structure 2 which recombine without emitting radiation on crystal defects such as these can be reduced when the density of crystal defects is reduced, thus resulting in an increase in the radiating recombination in the quantum structure and therefore in an increase in the internal quantum efficiency of the LED semiconductor body.

The compensation for the strain of the quantum layers 3 by means of the barrier layers 4 makes it possible to produce a comparatively large number of quantum layers 3 and barrier layers 4 with good crystal quality. In this case, the strained quantum layers and barrier layers are preferably arranged in an alternating sequence on one another.

The quantum structure 2 may contain more than four quantum layers 3, preferably ten or more quantum layers, for example 15 or more quantum layers. As the number of quantum layers increases, the linearity of the component with respect to the operating current, in particular at high current levels above 0.5 A, can be further improved.

Furthermore, an increase in the number of quantum layers can lead to a reduction in the spectral width.

In particular, the LED semiconductor body is preferably designed such that the spectrum of the radiation produced by the quantum structure has a width at half maximum of 70 nm or less, preferably 60 nm or less, and particularly preferably 50 nm or less, for example 40 to 45 nm.

The absolute value of the strain of a barrier layer 4 preferably has a value between 0.2 and 0.67 inclusive, particularly preferably between 0.33 and ½ inclusive of the absolute value of the strain of an adjacent quantum layer 3. In the case of a barrier layer such as this, the thickness of the barrier layer can be chosen to be correspondingly thicker than the quantum layer in order to compensate for the strain of the associated quantum layer. Two adjacent quantum layers 3 between which the barrier layer 4 is arranged can thus be at a comparatively long distance apart from one another. The energetic states which are forming in a quantum layer can thus advantageously be decoupled from those of the adjacent quantum layer. An LED semiconductor body with spectrally comparatively narrowband emission can thus be produced more easily.

A ratio of the thickness of the barrier layer 4 to the thickness of the quantum layer 3 of greater than or equal to 1, preferably greater than or equal to 1.5, and particularly preferably greater than or equal to 2.5, for example 3, has been found to be particularly advantageous. The thickness of the barrier layer may be 5 nm or more, preferably 10 nm or more, and particularly preferably 20 nm or more. The thickness of the quantum layers in this case is typically between 3 and 10 nm inclusive, for example 5 nm.

Figure 2:
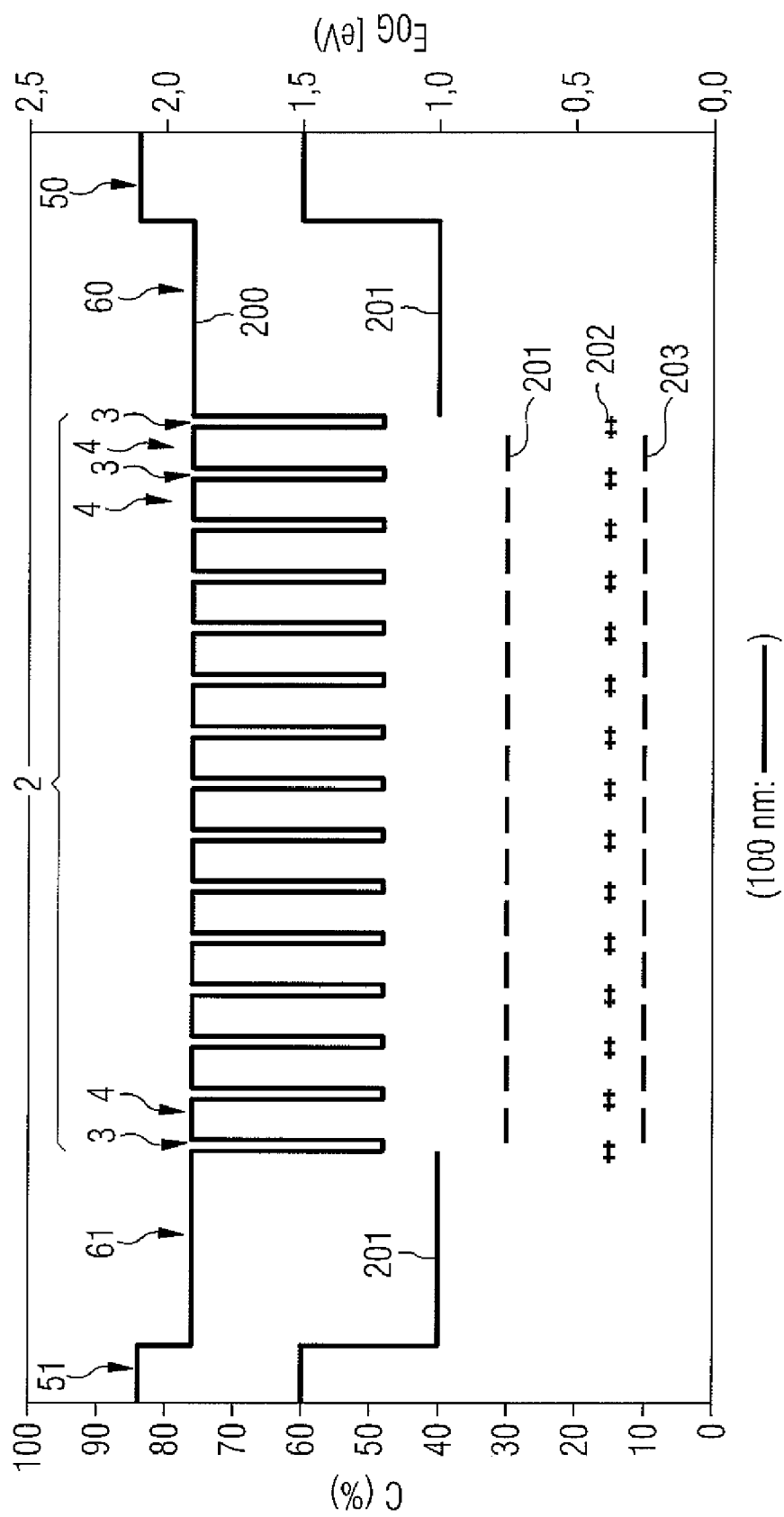
FIG. 2 shows an illustration, in the form of a graph, of the profile of the band gap and of the material compositions for one exemplary embodiment of an LED semiconductor body according to the invention, in the form of a section around a quantum structure of the LED semiconductor body.

The curve 200 in FIG. 2 shows the profile of the band gap $E_G$ for one exemplary embodiment of an LED semiconductor body according to the invention, in a section around the quantum structure 2. In this case, the figure also shows the area of the intermediate layers 60 and 61 as well as a part of the first cladding layer 50, which is adjacent to the first intermediate layer 60, and a part of the second cladding layer 51, which is adjacent to the second intermediate layer 61. The profile of the band gap $E_G$ is illustrated just by way of example for a semiconductor body which is designed to emit radiation with a peak wavelength of 940 nm.

In the exemplary embodiment shown in FIG. 2, the quantum structure 2 comprises fifteen quantum layers 3, with in each case one barrier layer 4 being arranged in each case between 2 adjacent quantum layers 3. The quantum layers each have a thickness of 7 nm, and the barrier layers have a thickness of 21 nm. The quantum layers are formed by means of $In_yGa_{1-y}As$, with the indium content being 15% for an emission wavelength of 940 nm. The barrier layers are formed by $Al_xGa_{1-x}As_{1-z}P_z$, with the aluminum content being 30% and the phosphorus content 10%. FIG. 2 shows the profile of the aluminum content by the curve 201, the profile of the indium content by the curve 202, and the profile of the phosphorus content by the curve 203.

An indium content of 15% results in straining of InGaAs with respect to the GaAs growth substrate of about 10,754 ppm. In this case, the InGaAs quantum layers 3 are compressive-strained with respect to GaAs.

The AlGaAsP barrier layers 4 with an aluminum content of x=30% and a phosphorus content of z=10% are tensile-strained with a strain absolute value of 3,593 ppm with respect to GaAs. The absolute value of the strain of the barrier layers is thus approximately one third of the absolute value of the strain of the quantum layers 3. In a corresponding manner, using a barrier layer 4 which is approximately three times as thick as the quantum layer 3, the strain of this quantum layer can be compensated for by the strain of this barrier layer since the product of the strain and the layer thickness for the barrier layer and for the quantum layer may then have the same absolute value, but with mutually opposite mathematical signs.

The mean strain of the quantum structure is typically in particular 2,000 ppm or less, preferably 1,000 ppm or less, particularly preferably 500 ppm or less. This allows a good crystal quality to be achieved in the quantum structure.

The stated material compositions should, of course, be regarded only as examples. Radiation with a longer or shorter peak wavelength, in particular in the wavelength range from 750 nm to 1050 nm, inclusive, can also be achieved by variation of the material composition and/or of the layer thicknesses of the quantum structure 2. By way of example, the band gap can be reduced by increasing the indium content, and this can lead to a longer peak wavelength.

Broadening of the quantum layers can also lead to a reduction in the transition energy in the recombination of an electron with a hole, and can thus lead to emission of radiation with a longer peak wavelength since the ground state energy of the charge carriers in the quantum layers is reduced when the quantum layers are broadened. The indium content may in this case be between but not including 0 and 100% inclusive, preferably between 5% and 30% inclusive, and particularly preferably between 10% and 20%, inclusive. Since increasing the indium content not only reduces the band gap of InGaAs but also increases the strain with respect to GaAs, it is expedient to appropriately match the composition of the barrier layers 4 to the composition of the quantum layers 3. Compensation for a higher strain of a quantum layer can in this case be achieved, for example, by increasing the phosphorus content in a barrier layer or by broadening the barrier layer.

Analogously to this, the emission of radiation with a longer peak wavelength can be achieved by reducing the indium content in a quantum layer 3. Because the strain of the InGaAs quantum layers decreases when the indium content is decreased, the strain of the quantum layers can be compensated for by thinner barrier layers 4 or by barrier layers with a lower phosphorus content.

Tensile-strained barrier layers 4 which contain AlGaAsP are particularly suitable for compensation for the strain of compressive-strained quantum layers 3 which are formed by means of InGaAs, since the strain of the barrier layers can be adjusted by means of the phosphorus content to a value which is suitable for strain compensation.

Furthermore, the band gap of AlGaAsP can be adjusted by means of the aluminum content. In this case, the barrier layers may have a band gap which is large in comparison to that of the quantum layers. A comparatively energetically low quantum well can thus be formed by means of an InGaAs quantum layer which is embedded between two AlGaAsP barrier layers with a correspondingly high aluminum content. The deeper the quantum well is, the lower is the probability of charge carriers in a quantized state of the quantum layer passing from the quantum layer into the barrier layer as a result of thermal excitation. The probability of charge carriers recombining in the quantum layer in a radiating form can in consequence advantageously be increased, thus increasing the internal quantum efficiency of the quantum structure 2.

The first intermediate layer 60 and the second intermediate layer 61 preferably have the same or essentially the same band gap as the barrier layer 4. In contrast to the barrier layers 4 in the quantum structure 2, however, the first and the second intermediate layers are preferably not strained or not significantly strained. In the exemplary embodiment shown in FIG. 2, the intermediate layers 60 and 61 are in the form of $Al_xGa_{1-x}As$ semiconductor layers, and have an aluminum content which is increased in comparison to an aluminum content of 30% in the barrier layers 4, for example an aluminum content of 40%. Since the intermediate layers are in the form of AlGaAs semiconductor layers, they are less strained with respect to GaAs. Additional straining of the semiconductor layer sequence of the semiconductor body 1 is thus advantageously avoided.

The aluminum content of the first cladding layer 50 and of the second cladding layer 51, which are each formed by means of AlGaAs, is preferably increased in comparison to the aluminum content of the intermediate layers 60 and 61. This in each case results in a potential jump at the transitions from the first intermediate layer 60 to the first cladding layer 50 and from the second intermediate layer 61 to the second cladding layer 51. The potential jump is expediently sufficiently great that there is a sufficiently lower probability of thermal excitation of charge carriers from the intermediate layer into the first cladding layer 50 and the second cladding layer 51. A sufficiently low probability is achieved if the difference between the band gaps at the point of the potential jump is considerably greater, for example approximately five times to ten times greater, than the mean thermal energy of charge carriers at the operating temperature of the semiconductor body. In the exemplary embodiment shown in FIG. 2, the potential jump is about 200 meV, which corresponds approximately to eight times the mean thermal energy of charge carriers at room temperature. It is thus possible to increase the proportion of charge carriers which recombine in the quantum layers 3 of the quantum structure 2 with radiation being emitted. This can lead to increased internal quantum efficiency of the LED semiconductor chip.

The cladding layers 50 and 51 are preferably comparatively thick, in comparison to the quantum structure. For example, the thickness is in each case at least twice the thickness of the quantum structure 2. The cladding layers are therefore used to provide mechanical stability for the quantum structure, in particular after removal of the growth substrate of the semiconductor body 1. The straining of the quantum layers and of the barrier layers need not necessarily be related to the growth substrate. For example, the straining can also be related to the cladding layers 50 or 51, which are thick in comparison to the quantum structure. The straining of the quantum layers 3 and barrier layers 4 in the quantum structure is thus maintained even after removal of the substrate. This advantageously makes it possible to avoid relaxation of the strain of the form of dislocations and a deterioration, associated with this, in the crystal quality of the quantum structure 2 after separation of the growth substrate.

Other semiconductor materials, in particular III-V semiconductor materials, can also be used, of course, for the semiconductor body 1 and for the growth substrate. For example, the semiconductor body and in particular the quantum structure 2 may contain InAs, GaSb, AlSb, InP, AlAs, AlP or GaP or a ternary or quaternary semiconductor material, which can be formed by means of these semiconductors.

The invention is not restricted by the description based on the exemplary embodiments. In fact, the invention covers every novel feature and every combination of features, in particular including every combination of features in the patent claims, even if this feature or this combination is not itself explicitly mentioned in the patent claims or the exemplary embodiments.

The invention claimed is:

1. An LED semiconductor body having a semiconductor layer sequence which comprises a quantum structure which is configured to produce incoherent radiation and comprises at least one quantum layer and at least one barrier layer, wherein the quantum layer and the barrier layer are strained with mutually opposite mathematical signs, wherein the LED semiconductor body is arranged on a carrier, and wherein a growth substrate on which the semiconductor layer sequence is deposited epitaxially has been removed.

2. The LED semiconductor body according to claim 1, wherein the LED semiconductor body is a thin-film semiconductor body.

3. The LED semiconductor body according to claim 1, wherein the quantum layer is compressive-strained, and the barrier layer is tensile-strained.

4. The LED semiconductor body according to claim 1, wherein an absolute value of a strain of the barrier layer is less than a strain of the quantum layer.

5. The LED semiconductor body according to claim 4, wherein the absolute value of the strain of the barrier layer has a value between 0.2 and 0.67 inclusive of the absolute value of the strain of the quantum layer.

6. The LED semiconductor body according to claim 1, wherein a ratio of a thickness of the barrier layer to a thickness of the quantum layer is greater than or equal to 1.

7. The LED semiconductor body according to claim 1, wherein a thickness of the barrier layer is at least 5 nm.

8. The LED semiconductor body according to claim 1, wherein the quantum layer contains $In_yGa_{1-y}As$ where $0 \leq y \leq 0.5$.

9. The LED semiconductor body according to claim 1, wherein the strained barrier layer contains $Al_xGa_{1-x}As_{1-z}P_z$ at least one of where $0.01 \leq x \leq 1$ and where $0.01 \leq z \leq 0.5$.

10. The LED semiconductor body according to claim 1, wherein the quantum structure comprises a further quantum layer and a further barrier layer, and the further quantum layer and the further barrier layer are strained with likewise mutually opposite mathematical signs.

11. The LED semiconductor body according to claim 10, wherein at least one of the further quantum layer is compressive-strained and the further barrier layer is tensile-strained.

12. The LED semiconductor body according to claim 10, wherein the strained quantum layers and the strained barrier layers are arranged in an alternating sequence on one another in the quantum structure.

13. The LED semiconductor body according to claim 1, wherein a mean strain of the quantum structure is 2000 ppm or less.

14. The LED semiconductor body according to claim 1, wherein the carrier mechanically stabilizes the semiconductor body.

15. The LED semiconductor body according to claim 14, wherein the carrier is different from the growth substrate on which the semiconductor body is deposited epitaxially.

16. The LED semiconductor body according to claim 14, wherein a mirror layer is arranged between the carrier and the semiconductor body.

17. The LED semiconductor body according to claim 16, wherein the mirror layer is metallic.

18. The LED semiconductor body according to claim 1, wherein the quantum structure is configured to produce radiation with a peak wavelength in a wavelength range between 750 nm and 1050 nm inclusive.

19. The LED semiconductor body according to claim 1, wherein the quantum structure is configured such that a width at half maximum of a spectrum of the radiation produced by the quantum structure is 70 nm or less.

20. The LED semiconductor body according to claim 1, wherein the quantum structure comprises at least 4 quantum layers.

21. An LED semiconductor body having a semiconductor layer sequence which comprises a quantum structure which is configured to produce incoherent radiation and comprises at least one quantum layer and at least one barrier layer, wherein the quantum layer and the barrier layer are strained with mutually opposite mathematical signs, wherein the LED semiconductor body is arranged on a carrier, wherein a growth substrate on which the semiconductor layer sequence is deposited epitaxially has been removed, wherein the strained barrier layer contains $Al_xGa_{1-x}As_{1-z}P_z$ at least one of where $0.01 \leq x \leq 1$ and where $0.01 \leq z \leq 0.5$, and wherein a metallic mirror layer is arranged between the carrier and the semiconductor body.

* * * * *